United States Patent [19]
Quellet

[11] Patent Number: 5,541,445
[45] Date of Patent: Jul. 30, 1996

[54] HIGH PERFORMANCE PASSIVATION FOR SEMICONDUCTOR DEVICES

[75] Inventor: Luc Quellet, Granby, Canada

[73] Assignee: Mitel Corporation, Kanata, Canada

[21] Appl. No.: 196,078

[22] PCT Filed: Aug. 10, 1992

[86] PCT No.: PCT/CA92/00346

§ 371 Date: Feb. 23, 1994

§ 102(e) Date: Feb. 23, 1994

[87] PCT Pub. No.: WO93/04501

PCT Pub. Date: Mar. 4, 1993

[30] Foreign Application Priority Data

Aug. 14, 1991 [CA] Canada ................................... 2056456

[51] Int. Cl.[6] .................................................. H01L 23/58
[52] U.S. Cl. .......................... 257/634; 257/637; 437/231; 437/235
[58] Field of Search .................................. 257/632, 634, 257/635, 637; 437/231, 235

[56] References Cited

U.S. PATENT DOCUMENTS 4,775,550 10/1988 Chu et al. ............................. 437/231
4,965,226 10/1990 Gootzen et al. ...................... 437/189
5,037,777 8/1991 Mele et al. ........................... 437/195
5,135,608 8/1992 Okutani ................................ 156/643
5,202,275 4/1993 Sugiura et al. ........................ 437/41
5,270,267 12/1993 Quellet ................................. 437/231

FOREIGN PATENT DOCUMENTS

WO9109422 12/1990 WIPO.

Primary Examiner—J. Carroll
Attorney, Agent, or Firm—Marks & Clerk

[57] ABSTRACT

A method of passivating a semiconductor device, comprises depositing a first dielectric passivation layer on the surface of the device, forming at least one planarization layer over the first passivation layer from an inorganic spin-on glass solution containing phosphorus and silicon organometallic molecules that are pre-reacted to form at least one Si.O.P bond between the phosphorus and silicon organometallic molecules, and subsequently depositing a second dielectric passivation layer on said at least one planarization layer(s). This results in improved step coverage of the underlying topography and permits much better protection against moisture related degradation than standard vapor phase deposited passivation layers even when the thickness of such layers is increased.

16 Claims, 9 Drawing Sheets

HIGH PERFORMANCE PASSIVATION FOR SEMICONDUCTOR DEVICES

This invention relates to a method of passivating a semiconductor device, and a semiconductor device passivated thereby.

Typical semiconductor devices consist of a large number of active components formed on a substrate and include one or two levels of polysilicon, polycide, silicide or a combination of thereof, as well as one, two or more levels of interconnect layers insulated by various dielectrics.

Moisture and ions of various types can have very important negative effects on the performance and reliability of such devices.

CMOS transistors show threshold voltage instabilities when sodium, $Na^+$, lithium, $Li^+$, potassium, $K^+$, hydrogen, $H^+$, hydronium, $H_3O^+$, and hydroxyl, $OH^-$, ions are allowed to approach the gate oxide area. Hydrogen, hydronium and hydroxyl ions originate from moisture ionization.

Interconnect materials, such as aluminum alloys and titanium-based refractory metals and compounds corrode when electrically polarized and exposed to moisture. These galvanic reactions occur faster when catalyst ions, such as chlorine, $Cl^-$, are present in trace levels and when elements like copper are used in the aluminum alloy.

Dielectrics are electrically affected by moisture. For example, bulk resistivity reduction, electrical polarization, hot electron effects, and slow trapping degradation. They are also affected mechanically in that they tend to acquire a compressive stress as they absorb moisture. They can also be chemically attacked, particularly when alloyed with boron and phosphorus. Decomposition to boric and phosphoric acids can result and initiate corrosion of surrounding interconnect materials.

In order to prevent moisture build-up and ion penetration in the device, it is known to form a passivation layer on the surface of the device. This is usually patterned to permit the opening of the bond pads to which bond wires are connected. The passivation layer also prevents conductive particles and scratches from shorting top interconnects.

The passivation layer can be deposited from silicon, oxygen, nitrogen, phosphorus and/or a gas containing another metallic element by, for example, atmospheric pressure chemical vapour deposition (APCVD), low pressure chemical vapour deposition (LPCVD), plasma enhanced chemical vapour deposition (PECVD), laser assisted chemical vapour deposition, LACVD, photo assisted chemical vapour deposition (PACVD), or electron cyclotron resonance chemical vapour deposition (ECRCVD). This layer can be deposited from silicon, and/or silicon nitride, and/or silicon oxide, and/or silicon oxinitride targets, with or without oxygen, nitrogen or any other reactive gas, by sputtering, reactive sputtering, biased sputtering, or reactive biased sputtering. It can also be deposited by any combination of these techniques.

The deposited film consists of silicon oxide, which can be alloyed with phosphorus or other metallic elements, silicon nitride, silicon oxinitride, or combination thereof.

Since the passivation layer is deposited from the vapour phase or by sputtering, the surface coverage is strongly affected by the exposed solid angle of the surface to cover. The upper topography, which is characterized by a large exposed solid angle receives more passivation material, and thus produces a thicker passivation layer than the recessed regions with only small solid angle exposed to the vapour from which the passivation layer grows. The net result is a passivation surface coverage that varies with the underlying topography and has many seems, gaps, voids and other weak points.

Water vapour molecules can diffuse in the passivation layer at a rate which is a function of its diffusion constant, D, in the passivation material. The time, t, needed for water to diffuse through the passivation material is proportional to the square of the passivation layer thickness $\delta^2$ and inversely proportional to the diffusion constant. This means that, at any temperature and for any concentration of moisture in the device area, a thick passivation layer $\delta_T$ should be much better than a thin one $\delta_t$ and the protection should increase as the square of the passivation layer thickness increase:

$$(t_T/t_t)=(\delta_T/\delta_t)^2$$

Doubling the thickness of the passivation layer should quadruple the resistance of these devices in any moist ambient. In practice, increasing the thickness of the passivation layer only gives a slight improvement in device protection because of the reduced step coverage at weak points.

The use of a partial etchback process using a semi-inorganic spin-on glass layer for a semiconductor device passivation application has been proposed by Intel [D. Pramanik, S. Nariani and G. Spadini, 6th Annual IEEE VMIC Conf., Santa Clara, Calif., June 12–13, 1989, pp. 454–462]. The spin-on glass was a 0.23 µm thick siloxane that was partially etched away using an $SF_6$ etchback plasma in order to remove most of the spin-on glass from the upper topography and to leave it in crevices.

However, it was later found that these siloxane spin-on glasses, which incorporate methyl, $.CH_3$, ethyl, $.C_2H_5$, propyl, $.C_3H_7$, or butyl, $.C_4H_9$, groups connected to silicon atoms in the spin-on glass solution and spin-on glass layer, cause field inversion, leading to failure of CMOS devices. Hydrogen from the organic groups of these quasi-inorganic spin-on glasses is the cause of the problem. Quasi-inorganic spin-on glasses cannot be used in passivation applications, particularly when a high hydrogen content plasma silicon nitride is deposited over the spin-on glass layer. The hydrogen from the silicon nitride and spin-on glass layers would interact and cause threshold voltage instabilities. Generally speaking, organic materials should be avoided in sensitive CMOS devices.

Since these quasi-inorganic spin-on glasses are not thermally stable at temperatures higher than about 450° C., the use of ceramic packages is very difficult. Furthermore as the quasi-inorganic spin-on glasses are readily destroyed during oxygen plasma exposure, dry photoresist strip is not possible. Saturation of the passivation layer with moisture may occur during wet photoresist strip.

Consequently attempts to avoid the problems caused by variations in thickness of the passivation layer by using spin-on glass have not been successful.

An object of the present invention is to alleviate the afore-mentioned disadvantages of the prior art.

According to the present invention there is provided a method of passivating a semiconductor device, comprising depositing a first dielectric passivation layer on the surface of the device, forming at least one planarization layer over said first passivation layer from an inorganic spin-on glass solution containing organometallic molecules of X and silicon, where X is selected from the group consisting of phosphorus, arsenic and antimony, said spin-on glass solution being pre-reacted to form at least one Si.O.X bond between said organometallic molecules of silicon and X, and subsequently depositing a second dielectric passivation layer on said at least one planarization layer.

Preferably, X is phosphorus.

By using a passivation sandwich, including an inorganic SOG (spin-on glass) planarization layer, the problems caused by varying thickness of the passivation layer can be substantiially reduced.

The inorganic spin-on glass solutions used in the present invention can be applied in a non-etchback process. They are doped with phosphorus and contain silicon and phosphorus organometallic molecules diluted in various kind of solvents and alcohols. These silicon and phosphorus organometallic molecules are pre-reacted in the solution in order to form at least one, and preferably two or more, silicon-oxygen-phosphorus, Si.O.P, bonds between phosphorus atoms of the phosphorus organometallic molecules and silicon atoms of the silicon organometallic molecules. The obtained phosphorus and silicon organometallic molecules are independent and in liquid solution in the solvent mixture but already connected by at least one, and preferably two, Si.O.P bonds prior to spinning. The silicon organometallic molecule is tetraethylorthosilane (TEOS). Such spin-on glass solutions are commercially available under the names Accuglass P-062A and Accuglass P-062LS, manufactured by Allied-Signal, Milpitas, Calif., USA.

Two similar solutions are manufactured by Filmtronics, Butler, Pennsylvania, USA and Tokyo Ohka Kogyo, Gotenba, JAPAN. These solutions are respectively named by their manufacturer as P-062F and OCD-2P-37313-SG. These two phosphosilicate solutions, however, as is the case for any other solution having the same characteristics, are not suitable for use in the present invention because of an inadequate pre-reaction of the spin-on glass solution and/or because the phosphorus organometallic molecule does not permit the formation of at least one and preferably two or more .Si.O.H. bonds between phosphorus atoms of the phosphorus organometallic molecules and silicon atoms of the silicon organometallic molecules. For these solutions, Si.O.P bonds only form during spin-on glass film curing and the obtained phosphorus doped silicate film has poorly bonded phosphorus, prone to leaching and prone to form phosphoric acid in presence of moisture.

The phosphorus organometallic molecule, the silicon organometallic molecule, TEOS, water and the various alcohols, schematized as R.O.H in the formula below, are then pre-reacted in order to obtain, in the spin-on glass solution, complex organometallic molecules, of about 1000 to 5000 u.m.a. of molecular weight, in suspension in the solution containing water, alcohols, and catalyst acids. The various alcohol molecules form Van der Waals bonds with the peripheral silanol bonds, .SiOH, thus blocking silanol-silanol condensations that would result in an increase of the compound molecular weight and of the water content in the solution.

During coating and spinning over the previously deposited dielectric film, solvents and water evaporate and spin-on glass polymerisation occurs as a result of the condensation of silanol pairs, thus resulting in the formation of excess water, which evaporates. Polymerization of the spun film stops when the distance between neighbouring silanol groups becomes too large or when too much by-product, such as water vapour, blocks the condensation mechanism. Heating is then required to eliminate condensation by-products and permit further condensation, densification, and the formation of a hard phosphorus doped inorganic layer, i.e. the SOG layer.

As mentioned in our Canadian co-pending patent application no. 2,006,174, a non etch-back multiple coating sequence, using two or more layers of spin-on glass, is needed in order to prevent film cracking. An in-line cure to a temperature of at least 300° C. and preferably at least 350° C. is also needed in order to insure silanol-ethoxy groups, .SiOH—.SiOC$_2$H$_5$, condensation, important film shrinking and ethanol evaporation between each coat.

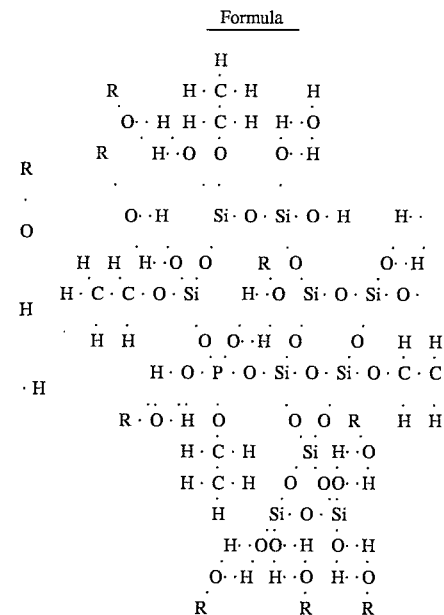

Formula

As mentioned in our Canadian patent application no. 2,017,719 during, between, and after each one of the multiple coats of spin-on glass, the silicon wafer is transported, cured and stored in a moisture-free ambient in order to prevent water molecules from breaking Si.O.P bonds upon processing.

As mentioned in our Canadian patent application no. 2,017,710, the final multiple coats spin-on glass layer is in-situ cured in a dry ambient or preferably in a vacuum at temperatures of about 425° C. for about one hour prior to the deposition of the upper protective dielectric.

It is possible to more efficiently cure the spin-on glass layer of wafers located on one or more electrodes of a plasma reactor by using the electrical field generated near the surface of the wafer by the inert or reactive gas glow discharge. This curing sequence is particularly attractive and efficient when the upper protective layer is a plasma deposited film deposited in a vacuum load-locked parallel plate reactor as the case for PECVD SiN in a NOVELLUS reactor.

The final density of the spin-on glass layer depends on many factors but is generally lower than the density of other inorganic glasses deposited by other commonly used techniques like LPCVD or PECVD. This lower density is due to the presence of many pores in the spin-on glass layer which cause high conductance channelling paths between the spin-on glass surface and its bulk.

These pores permit the adsorbed gas molecules present on the SOG film surface to continuously and rapidly diffuse through the bulk of the film and to rapidly connect physically to the glass by forming low energy (<0.1 eV) Van der Waals bonds (shown as ".."). The gas molecules are rapidly absorbed physically by the SOG film network.

Water vapour can slowly form high energy (>0.1 eV) chemical bonds (drawn as "." on the following diagram) with the SOG film network by forming a pair of silanol groups, .SiOH. Water is slowly chemically absorbed by the SOG film network:

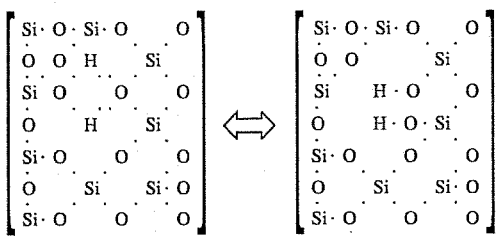

This slow chemical absorption of water vapour by the SOG film is particularly efficient if the SOG solution contains phosphorus organometallic molecules which give very efficient water vapour gettering due to the presence of phosphorus-oxygen double bonds in the SOG film:

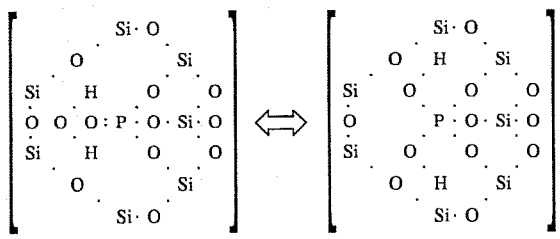

Our recent patent Canadian application nos. 2,027,720 and 2,023,172 show that these physical and chemical reactions involving water vapour and .P:O or .SiOSi. bonds are reversible ones at relatively low temperature. The spin-on glass layer is easily dried if exposed to a dry ambient or preferably a vacuum at temperatures of about 425° C. for a time sufficiently long to permit:

(1) Slow chemical desorption, or destruction of chemical bonds with the glass network, (2) Rapid physical desorption, or destruction of the Van der Waals bonds with the glass network, (3) Rapid diffusion from the bulk to the surface through adjacent pores, and (4) Rapid desorption from the surface The obtained spin-on glass layer is dry and, as mentioned in our recent Canadian patent application no. 2,032,763, contains less hydrogen then typical vapour deposited phosphosilicate layers that are normally used as passivation layers.

Spin-on glass layer exposure to moist air causes extremely rapid readsorption of water vapour at the film surface, rapid diffusion from pore to pore, rapid physical reabsorption and chemical reabsorption. Since the spin-on glass layer is more porous than the surrounding vapour deposited glasses and since the pores of the spin-on glass layer are normally under vacuum, the spin-on glass layer will very rapidly absorb more water vapour, as bonded $H_2O$, and chemically absorb more of it, as .SiOH groups, than its equivalent volume of vapour deposited glasses when exposed to air or to a pressure cooker ambient. The same way, since the spin-on glass layer incorporates phosphorus, water vapour will also be chemically bonded as .POH groups.

Being more active than for moisture absorption, the spin-on glass layer will then protect the surrounding dielectrics against moisture absorption and, for any given moisture load, will maintain higher their bulk resistivity.

The resulting device, which incorporates a dry spin-on glass layer, will have an improved barrier against water vapour penetration to device transistors during highly accelerated stress testing (HAST), temperature and humidity bias testing (THB), other reliability testing, or simply in the field.

The first layer can be deposited by atmospheric pressure chemical vapour deposition (APCVD), low pressure chemical vapour deposition (LPCVD), plasma enhanced chemical vapour deposition (PECVD), laser assisted chemical vapour deposition (LACVD), photo assisted chemical vapour deposition (PACVD), electron cyclotron chemical vapour deposition (ECRCVD), sputtering, biased sputtering, reactive sputtering, or any combination of these techniques. Plasma enhanced chemical vapour deposition (PECVD) is preferred.

This first layer can be silicon dioxide, stoichiometric or not, doped or not with metallic elements like phosphorus. It can be silicon nitride, stoichiometric or not, or silicon oxinitride. It can also be a combination of these materials. Undoped and stoichiometric silicon dioxide is preferred. The thickness of this first dielectric layer is about 0.2 to 1.0 μm and preferably 0.5 μm.

The equipment used for the deposition of this first dielectric layer can be a single wafer machine, a batch machine, and can be independent or integrated to the spin-on glass processor that is used for the spin-on glass deposition.

The spin-on glass solution used is a phosphorus doped spin-on glass solution that permits the formation of a film having about 1.0 to 5.0 wt % and preferably 2.0 wt % phosphorus, after a final cure at about 425° C. The phosphorus atoms contained in the complex organometallic molecules of the spin-on glass solution are bonded to the silicon atoms of these complex organometallic molecules by at least one and preferably more than one Si.O.P bond(s).

The thickness of a single coat spin-on glass film obtained after spinning at a speed of rotation of 4000 RPM for about 20 seconds, at a temperature of about 21° C., and a relative humidity of about 40% RH is about 5 nm to 150 nm, preferably 75 nm thick.

The coated wafer is preferably transported from the spin area to the first in-line hot plate in a nitrogen dry ambient. The nitrogen dry ambient should be maintained up to the transfer to the second dielectric deposition equipment that is used to deposit the top layer which protects the multiple coat spin-on glass layer).

The wafer can be automatically transported in the dry nitrogen ambient through successive hot plate stations in order to evaporate residual solvents, to evaporate residual moisture, to permit the condensation of far neighbouring silanol groups which results in the formation of more water to evaporate, to permit an efficient condensation of ethoxy groups with neighbouring silanol groups which results in the formation of more ethanol to evaporate, and to insure a gradual volumetric contraction.

The temperature of these various hot plates increases from the first to the last, the first one being at a temperature lower than 120° C. and preferably 80° C. while the last is at a temperature of at least 300° C. and preferably 350° C. or higher. The ambient around these hot plates is dry nitrogen.

After completion of the in-line cure, each wafer is cooled in a dry nitrogen ambient and sent back to the coating area for the addition of another coat and for another in-line cure cycle.

After completion of this multiple coats and in-line cures sequence, which can accumulate between two and five, and preferably four coats of spin-on glass, the wafers are rapidly transferred to the independent or integrated equipment that is used to deposit the top protective layer. Minimization of air exposure is important for an independent equipment and, for that reason, a dry nitrogen or vacuum transport mechanism to an integrated equipment is preferred.

The independent or integrated equipment permits an in-situ final cure prior to the deposition of the top protective layer. The role of this in-situ cure is to dry the spin-on glass layer by condensing as much as possible the silanol groups and to evacuate as much as possible the water vapour.

The top protective layer can be deposited by atmospheric pressure chemical vapour deposition, APCVD, low pressure chemical vapour deposition, LPCVD, plasma enhanced chemical vapour deposition, PECVD, laser assisted chemical vapour deposition, LACVD, photo assisted chemical vapour deposition, PACVD, electron cyclotron chemical vapour deposition, ECRCVD, sputtering, biased sputtering, reactive sputtering, or any combination of these techniques. Plasma enhanced chemical vapour deposition, PECVD, is preferred and an in-situ plasma cure of the spin-on glass, as described in our patent application: "CURING AND PASSIVATION OF SPIN-ON GLASSES BY A PLASMA PROCESS, AND PRODUCT PRODUCED THEREBY", is preferred.

The second layer can be silicon dioxide, stoichiometric or not, doped or not with metallic elements like phosphorus. It can be silicon nitride, stoichiometric or not, or silicon oxinitride. It can also be a combination of these. A plasma enhanced chemical vapour deposited silicon nitride deposited at a temperature lower than about 450° C. and having a compressive stress lower than 2.0 E9 dynes/cm$^2$ and a concentration of Si-H bonds lower than 4.0 E21/cm$^3$ being preferred. The thickness of this second dielectric layer is about 0.5 to 1.5 μm and preferably 1.0 μm.

The invention will now be described in more detail, by way of example only, with reference to the accompanying drawings, in which.

Figure 1:
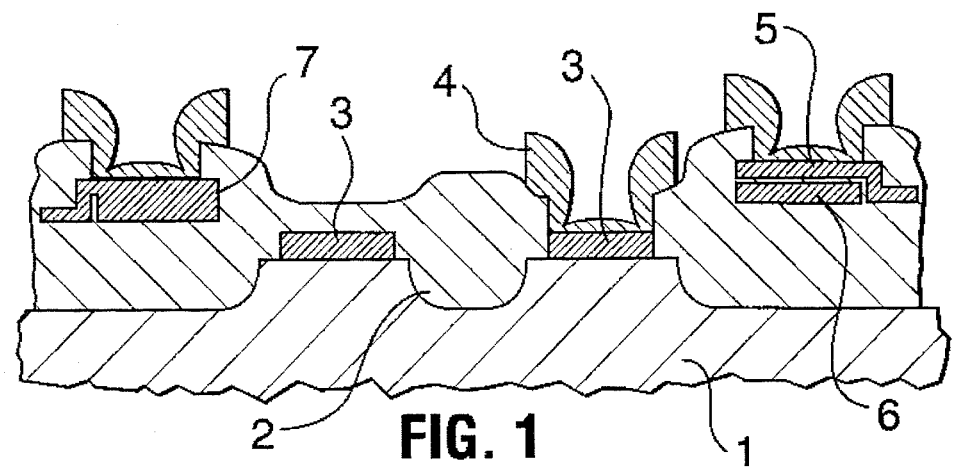
FIG. 1 shows a semiconductor double level polysilicon, single level interconnect prior to the application of a passivation layer.

Referring now to the drawings, the semiconductor device shown in FIG. 1, which is shown prior to the application of a passivation layer, comprises a silicon substrate 1, a field oxide 2, polysilicon, silicide or refractory metal gate 3, and contact 4 to a capacitor electrode, gate or the silicon substrate. Upper and lower capacitor electrodes 5, 6 are made of polysilicon, polycide or refractory metal. The device is planarized with a reflowed BPSG layer or a spin-on glass layer 7.

Figure 2:
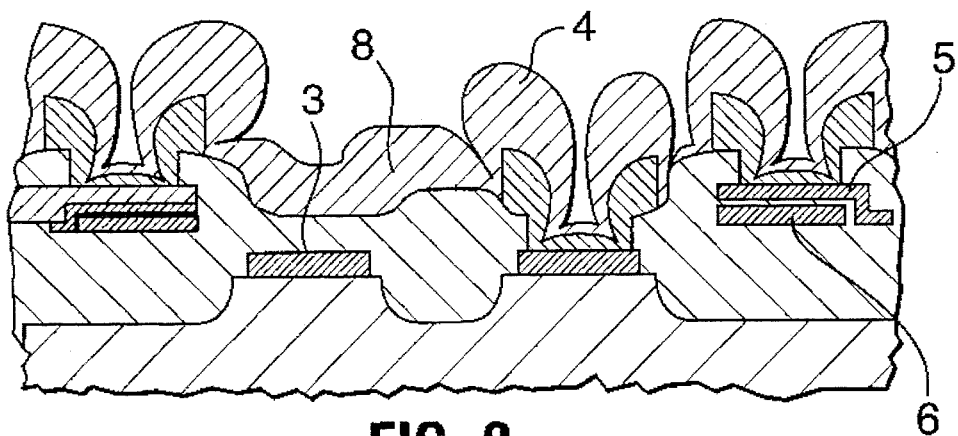
FIG. 2 shows the device shown in FIG. 1 with a passivation layer applied in accordance with the prior art.

When the passivation layer 8 is applied using conventional techniques, the result is shown in FIG. 2. The surface coverage varies, with many seems, gaps, voids and other weak points formed in the layer 8.

Figure 3:
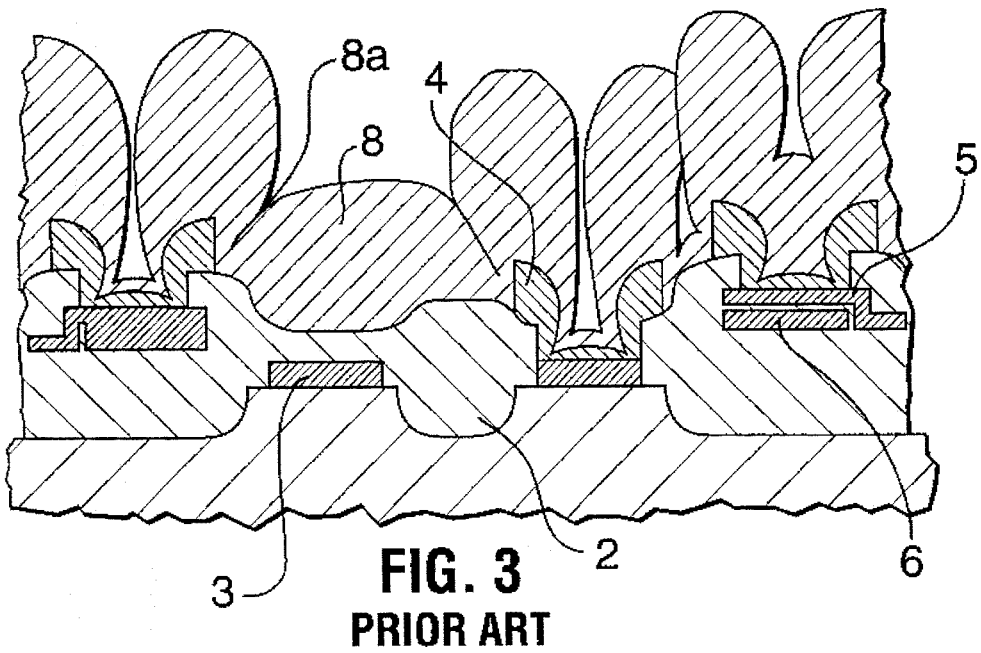
FIG. 3 shows the effect of increasing the thickness of the passivation layer in the device shown in FIG. 2.

FIG. 3 shows what happens when the thickness of the passivation layer is increased. Only minimal improvement in the performance of the device is observed due to reduced step coverage at weak points 8a.

Figure 4A:
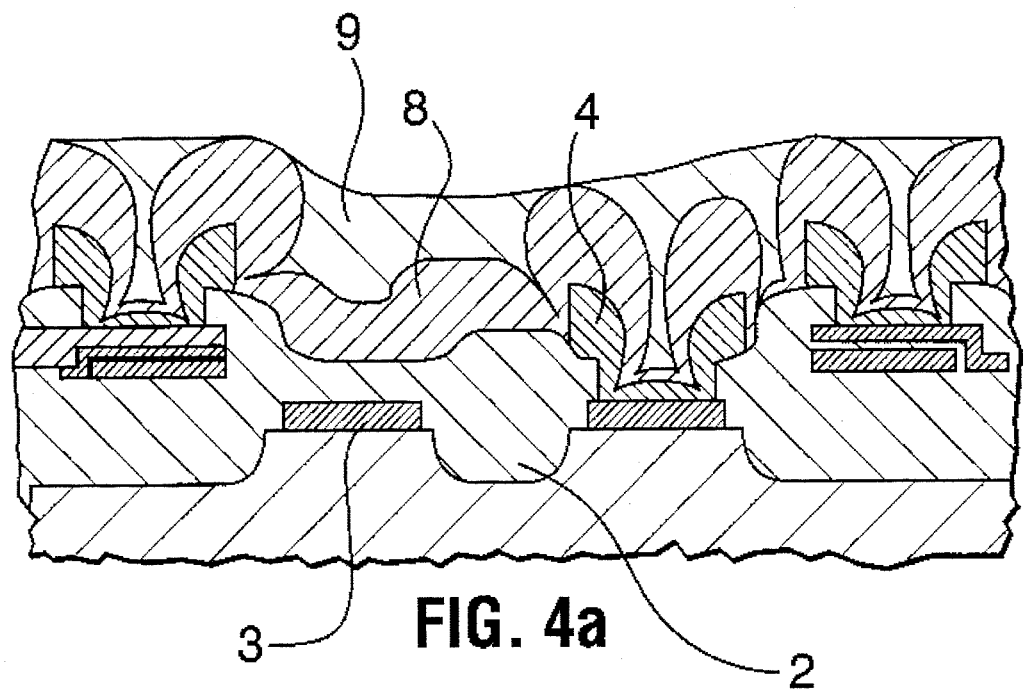
FIGS. 4a and 4b illustrate the steps in forming a spin-on glass passivation sandwich in accordance with the invention.
Figure 4B:
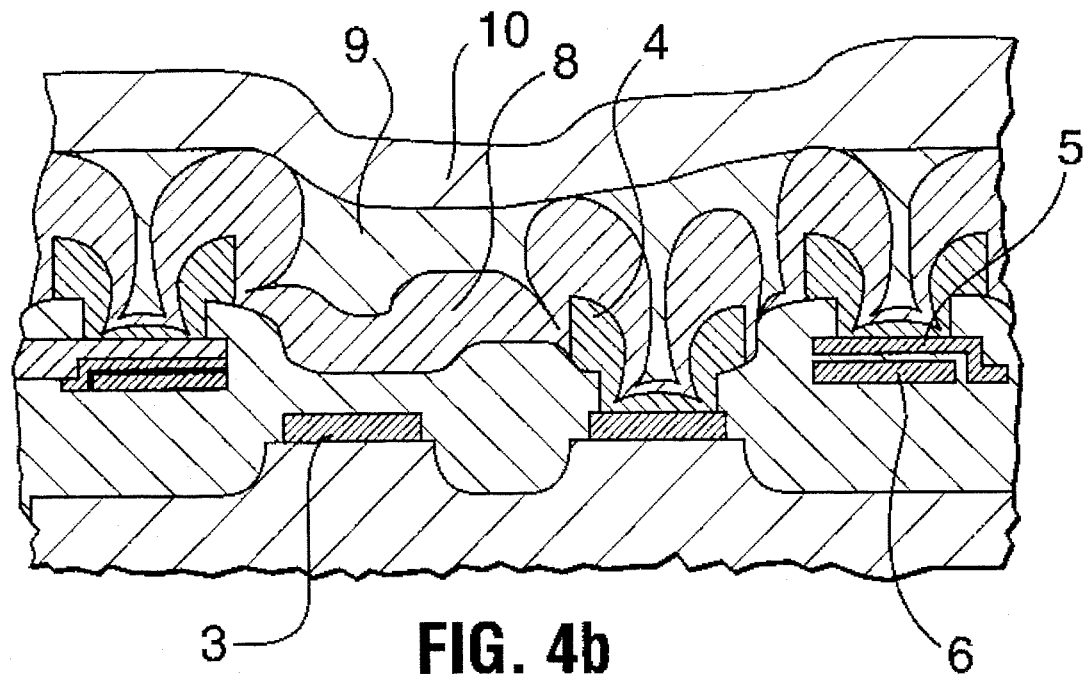

The fabrication of a device in accordance with the invention will now be described with reference to FIGS. 4a and 4b. First, a conventional passivation layer is deposited by vapour phase deposition onto the partly completed device shown in FIG. 1 to produce a device as shown in FIG. 2. Next, a phosphorus-doped, inorganic spin-on glass layer 9, such as Accuglass P-062A, manufactured by Allied-Signal, Milpitas, Calif., USA, pre-reacted to form at least one Si.O.P bond between the phosphorus and silicon organometallic molecules is applied and cured in one or many coats over the deposited first layer 8. While phosphorus is preferred, the invention could also be made to work with arsenic or antimony. This SOG layer fills crevices and ensures a smooth upper surface.

Finally, another passivation layer 10 is deposited by vapour phase deposition onto the SOG layer(s) 9. The resulting sandwich has few or no weak points. The passivation layer thickness is equal or larger than the combined thickness of the two vapour phase deposited films.

Since the SOG approach prevents the formation of weak points by ensuring a minimum thickness of at least the sum of the two vapour deposited layers' thickness, it is much more effective than that employing double thickness vapour deposited passivation.

The use of an inorganic spin-on glass solution containing phosphorus and silicon organometallic molecules, with the spin-on glass solution being pre-reacted to form at least one Si.O.P bond between said phosphorus and silicon organometallic molecules, avoids the moisture problems noted above.

Since the bulk resistivity of dielectrics degrades rapidly in presence of moisture, the performance of the standard passivation layer, of a double thickness passivation layer and of the SOG passivation sandwich can be verified by monitoring the leakage current between two independent combs (see FIG. 5) as the moisture content over the passivation layer is increased.

Figure 6A:
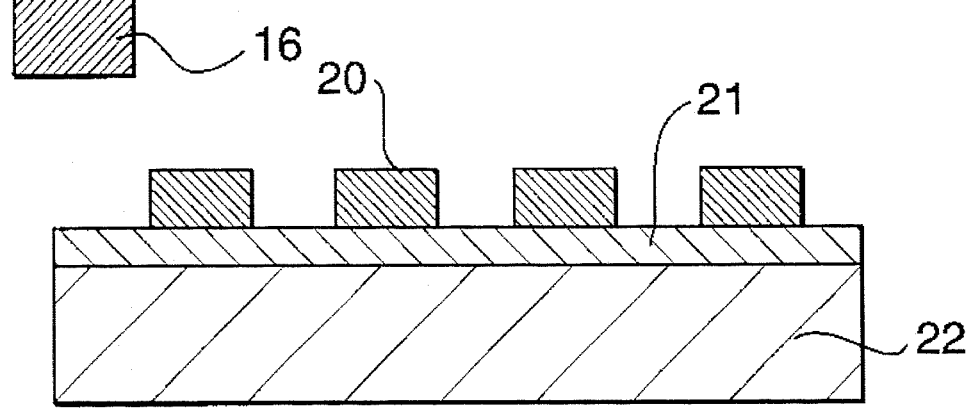
FIGS. 6a and 6b show two underlying strucures for the comb arrangement.
Figure 6B:
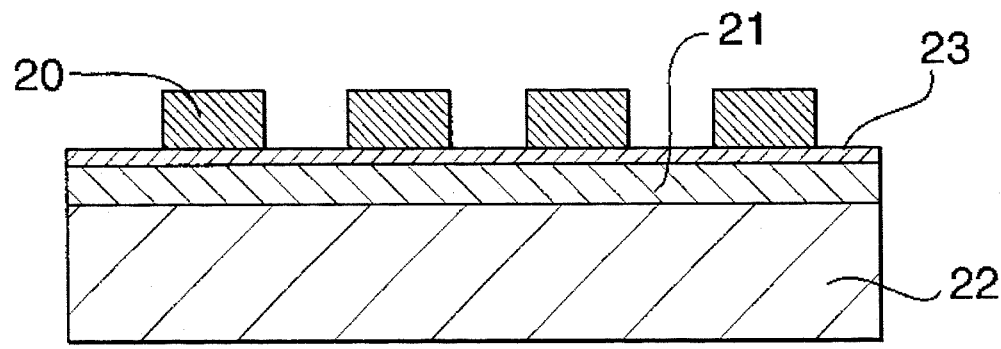

Two underlying film structures A, B were used in order to verify the leakage current between the two independent combs. In the first case, structure A, (FIG. 6a), the combs 20, formed by an interconnect layer, sit on a field oxide 21 grown from the underlying substrate 22. In the second case, structure B, (FIG. 6b), the comb 20 sits on a spin-on glass layer 23 deposited over a field oxide 21 previously grown from the underlying substrate 22.

Figure 5:
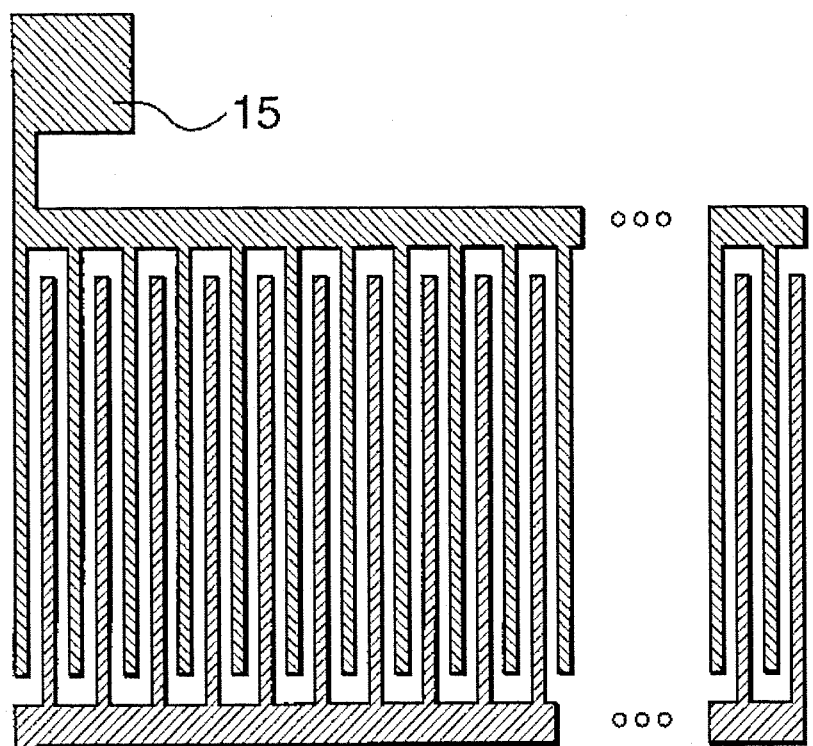
FIG. 5 is a diagram of a comb arrangement used to verify the performance of a passivation layer.

Electrical testing of the leakage current between the two independent combs was performed at a bias of 100 volts applied between bond pads 15, 16 (FIG. 5). This voltage induces an electrical field of 0.5 MV/cm in the dielectric material that insulates the two combs. When completely dry, this insulating dielectric has a bulk resistivity of about 1.0E+16 Ωcm. The penetration of moisture in the dielectric area causes this bulk resistivity to be reduced by many orders of magnitude. The leakage current monitoring can trace this penetration.

Since the two independent combs are 0.8 μm thick, since they are isolated by about 2.0 μm of dielectrics, since their total exposed length is about 349958 μm per structure (994.2 μm/arm×2 arm/pitch×88 pitches/comb×2 comb/structure), then the leakage current should be about 0.1 pA or −1.0 on a log scale in pA units.

About 172 measurements of the inter-comb leakage current were performed and plotted on a log scale (in pA):

1). For each one of the two wafer structures: structure A, without underlying SOG layer, structure B, with an underlying SOG layer under the pair of combs in order to increase the leakage current for the same moisture penetration, 2). For each one of the three tested passivation layers: simple passivation, which is a single thickness layer of the standard passivation material, double passivation, which is a double thickness layer of the passivation material, SOG passivation, which is a combination of a passivation layer deposited under a spin-on glass film, which is spun under another passivation layer. The cumulative thickness of this SOG passivation, is similar to one of the double passivation layer.

3). For three test conditions: as deposited, which means after completion of the device and without any intentional moisture exposure, after one hour of pressure cooker at 121° C. and about 180 kPa of moisture, and after ten hours of pressure cooker at 121° C. and about 180 kPa of moisture.

Figure 7A:
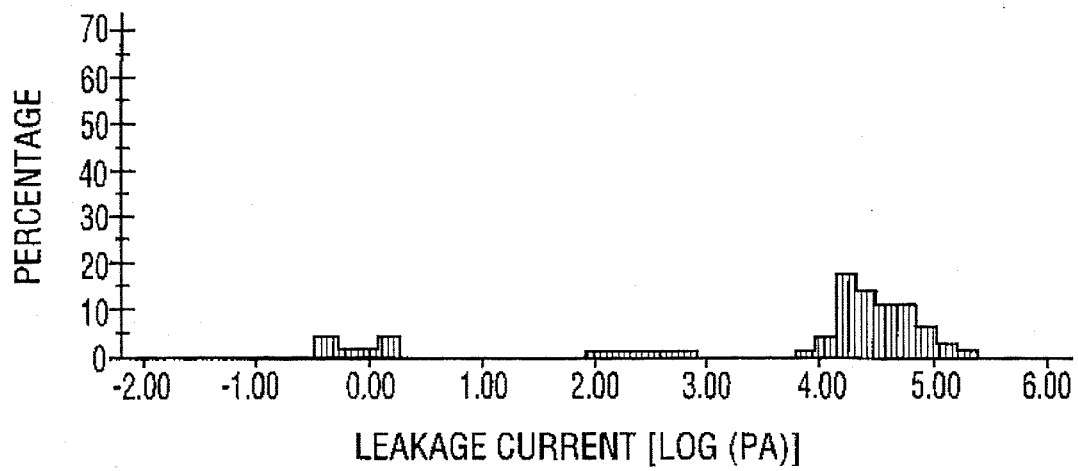
FIGS. 7a to 7c are diagrams showing the leakage current for single, double, and SOG-sandwich passivation layers as deposited measured by the first comb structure, i.e. without a SOG undrlayer.
Figure 7B:
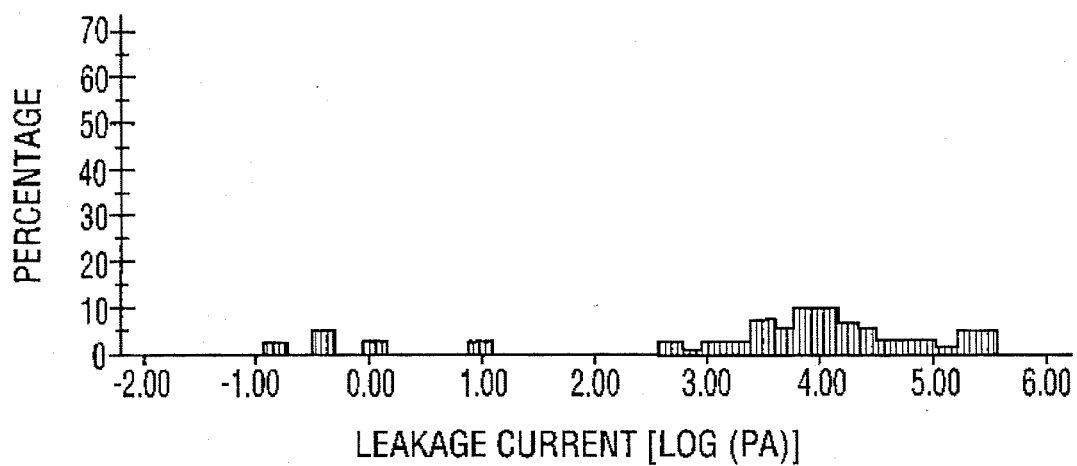
Figure 7C:
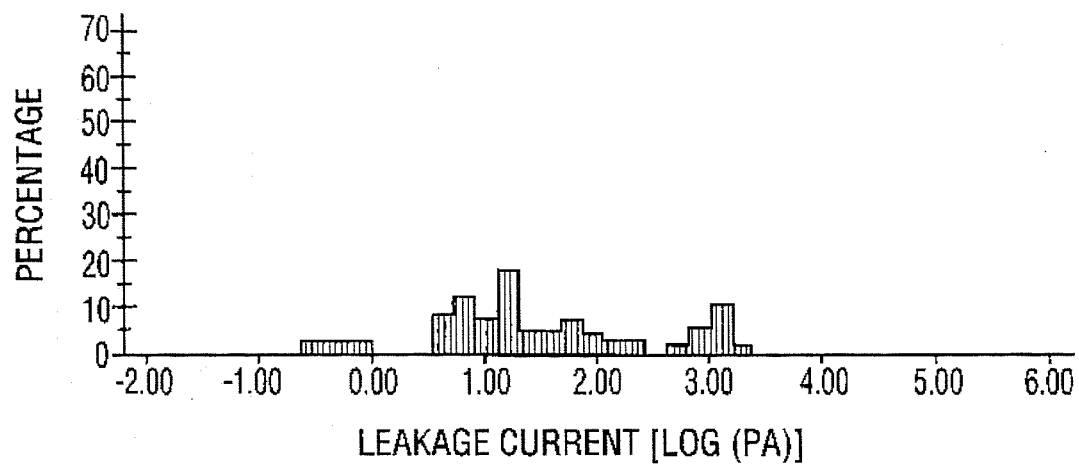

The leakage current (about 1,000 pA or 1 nA) associated with the as-deposited structure A (without SOG underlayer) using single passivation and double passivation (FIGS. 7a, 7b) shows that this type of passivation is not adequate to prevent residual moisture absorption from moist air of the manufacturing area. A three order of magnitude lower leakage current (about 2 pA) is associated with the improved step coverage of the SOG passivation (FIG. 7c) and confirms that this improved step coverage eliminates residual moisture.

Figure 8A:
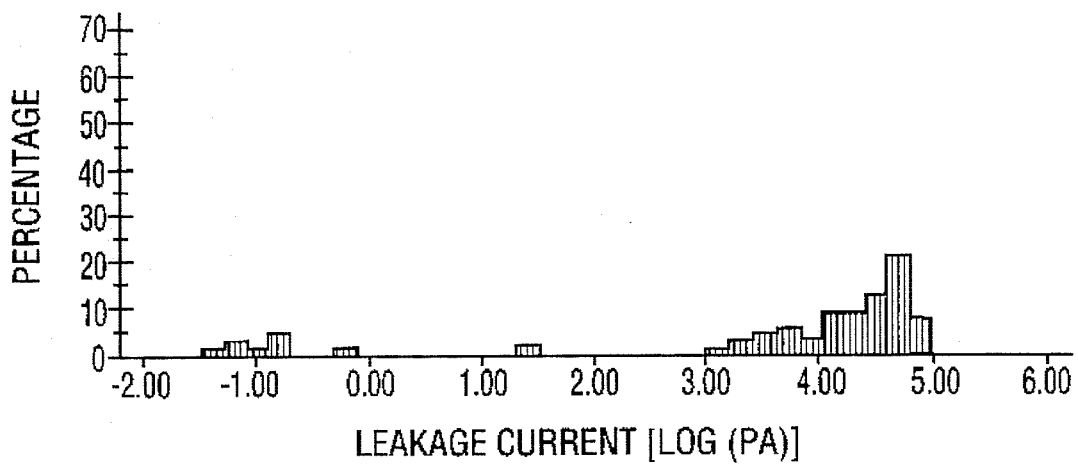
FIGS. 8a to 8c are diagrams showing the leakage current for single, double, and SOG-sandwich passivation layers measured by the second comb structure, i.e. with a SOG undrlayer.
Figure 8B:
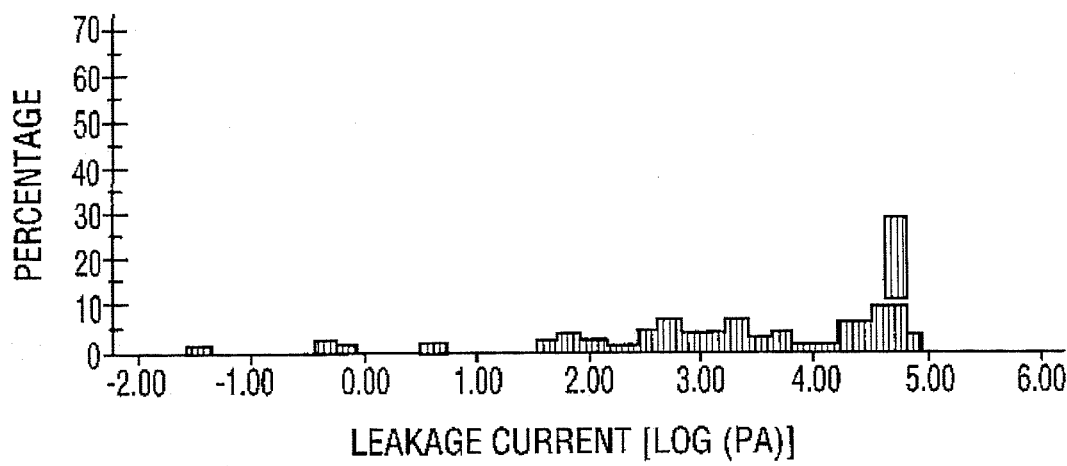
Figure 8C:
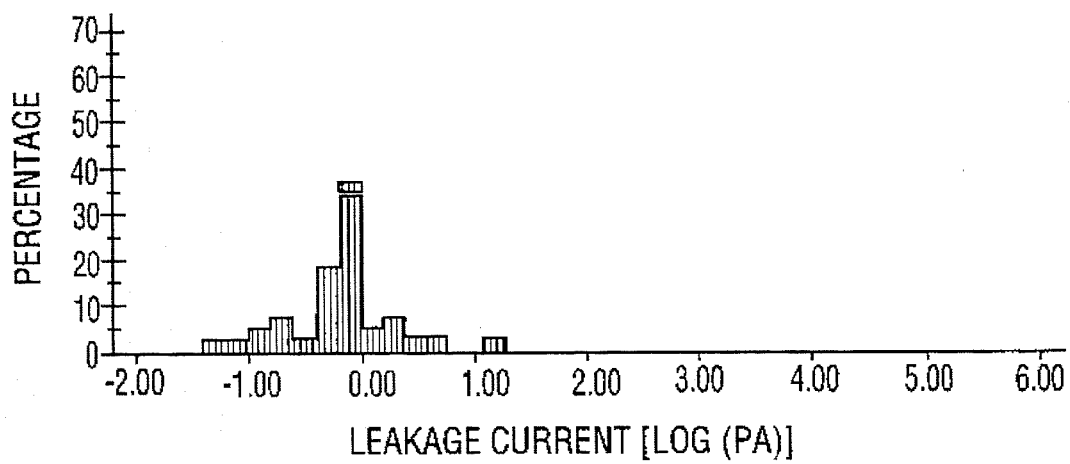

The residual moisture effect is even more spectacular in the case of as-deposited structure B (with SOG underlayer) because the bulk resistivity of SOG in presence of moisture drops much more quickly than the one of field oxide. In this case, single passivation and double passivation (FIGS. 8a and 8b) show a higher leakage current (about 50,000 pA or 50 nA) while the leakage current of the SOG passivation (FIG. 8c) stays ten thousand times lower (about 2 pA). This second structure is much more sensitive for the detection of moisture in dielectrics.

Figure 9A:
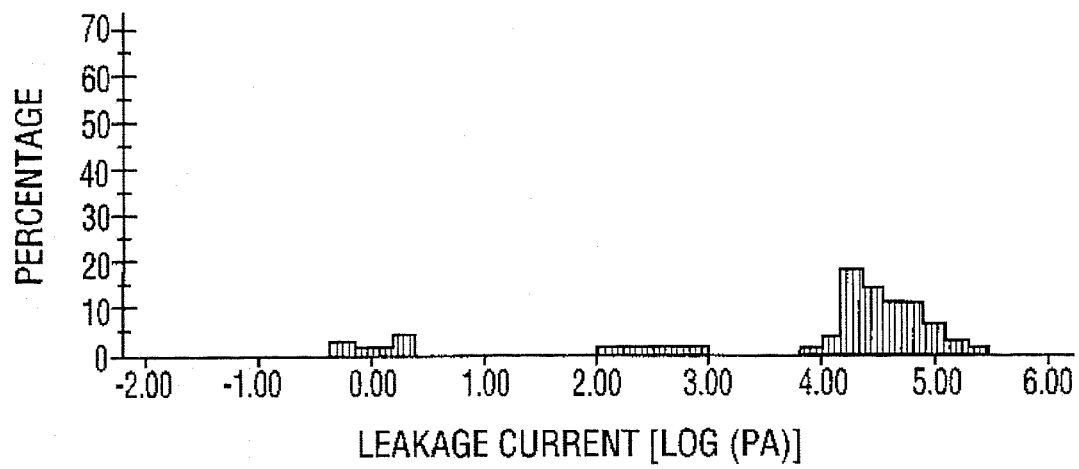
FIGS. 9a to 9c show similar results to FIGS. 7a to 7c after one hour in a pressure cooker.
Figure 9B:
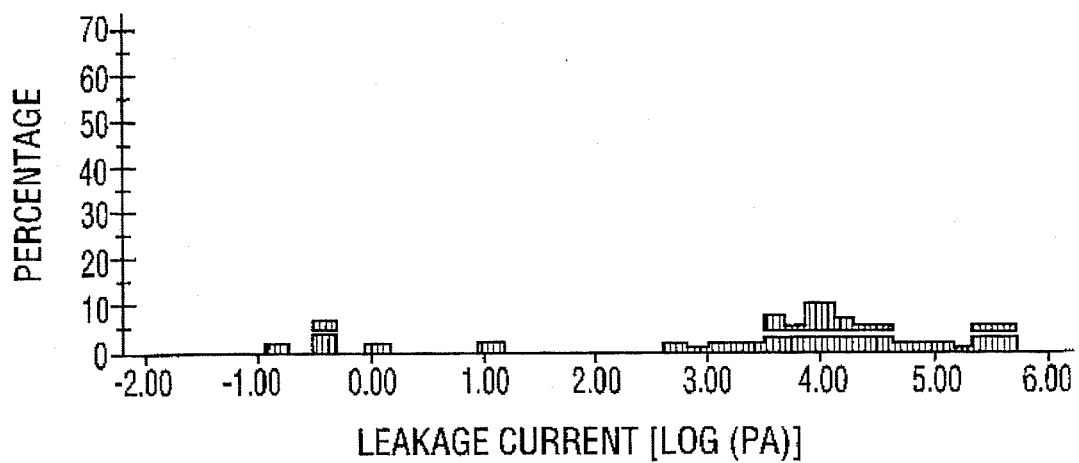
Figure 9C:
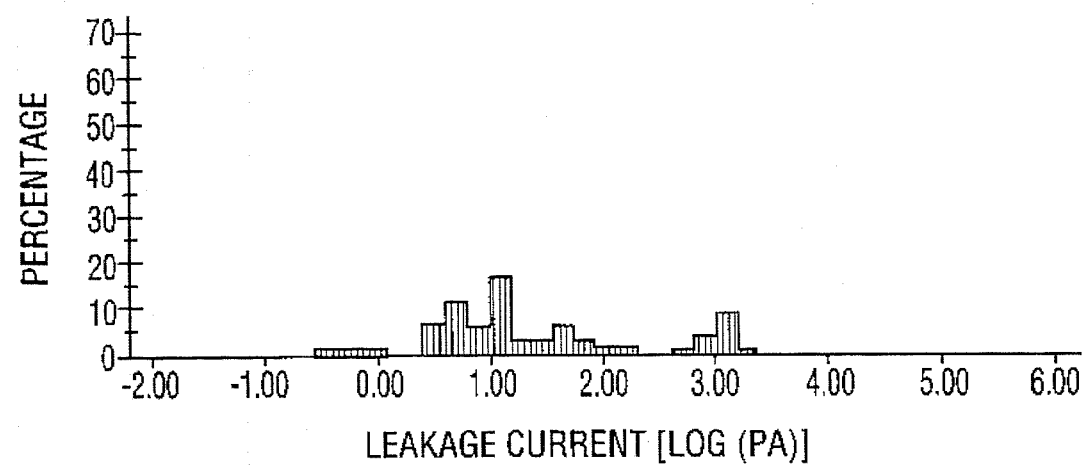

A one (1) hour pressure cooker exposure at 121° C. and 175 kPa causes moisture penetration in the dielectrics and increases inter-comb leakage current if the passivation is not absolute. The high leakage current (about 50,000 pA or 50 nA) associated with the structure A after one hour in a pressure cooker (without SOG underlayer) using single passivation (FIG. 9a) shows the permeability of this passivation. The comparable leakage current (about 10,000 pA or 10 nA) associated with double passivation (FIG. 9b) shows that the improvement of a double thickness is minimal, as predicted by the step coverage discussion. A three order of magnitude lower leakage current (about 50 pA) is again associated with the SOG passivation (FIG. 9c) and shows the beneficial effect of the improved step coverage of the SOG.

Figure 10A:
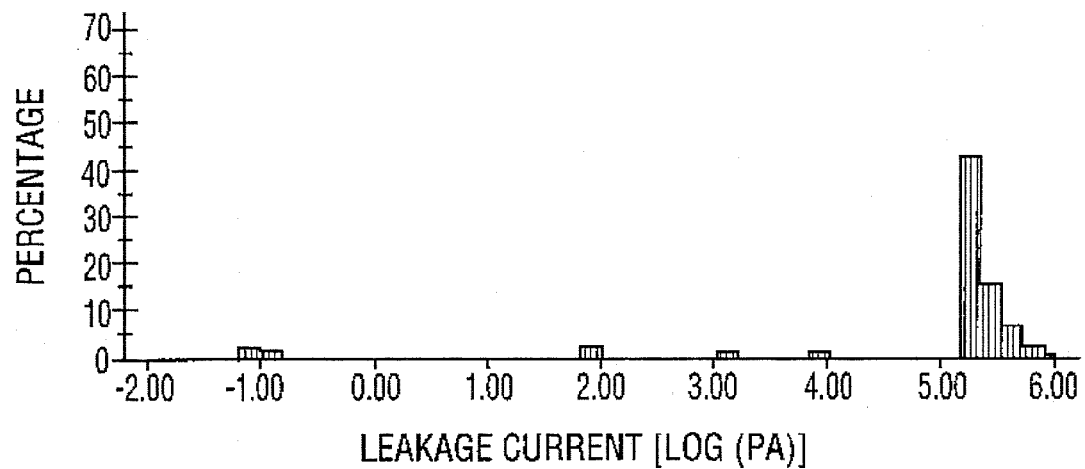
FIGS. 10a to 10c show similar results to FIGS. 8a to 8a e after one hour in a pressure cooker.
Figure 10B:
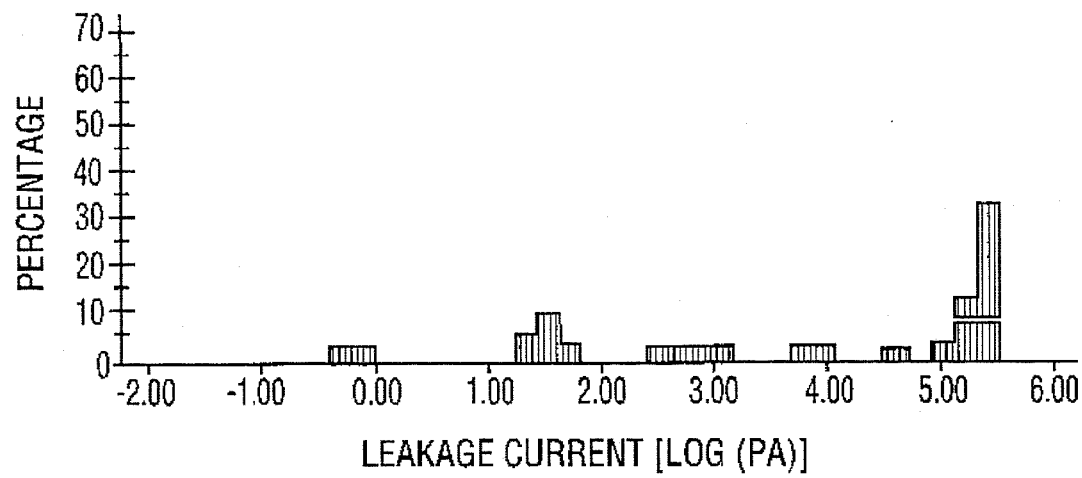
Figure 10C:
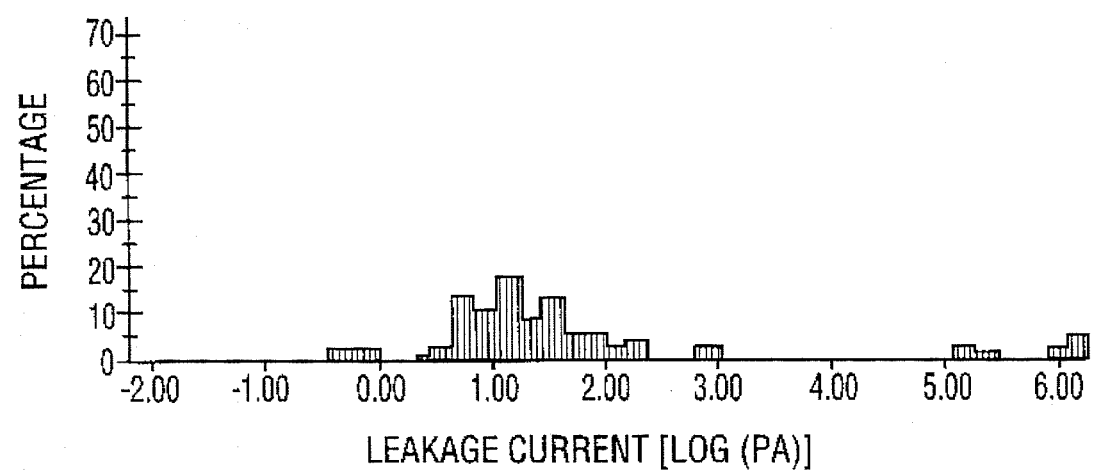

The step coverage effect is spectacular in the case of structure B after one hour in a pressure cooker. In this case, single passivation and double passivation (FIGS. 10a and 10b) show almost the same leakage current (about 300,000 pA or 0.3 μA) while a ten thousand times lower leakage current (about 10 pA) is maintained with the SOG passivation (FIG. 10c). When compared with the 300,000 pA leakage current of these single passivation and double passivation, the 10 pA leakage current of the SOG passivation is probably the most convincing indication of the high performance due to the improved step coverage of the SOG passivation.

Figure 11A:
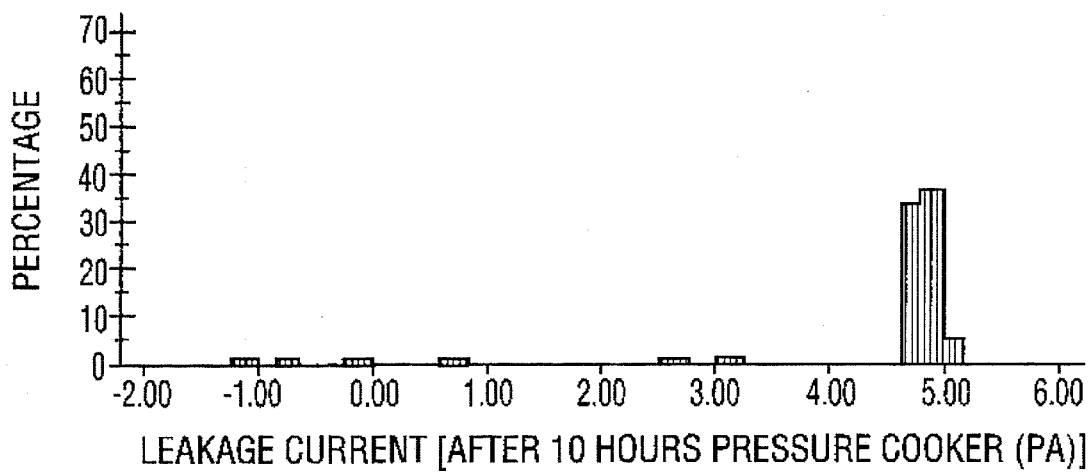
FIGS. 11a to 11c show similar results to FIGS. 7a to 7c after ten hours in a pressure cooker.
Figure 11B:
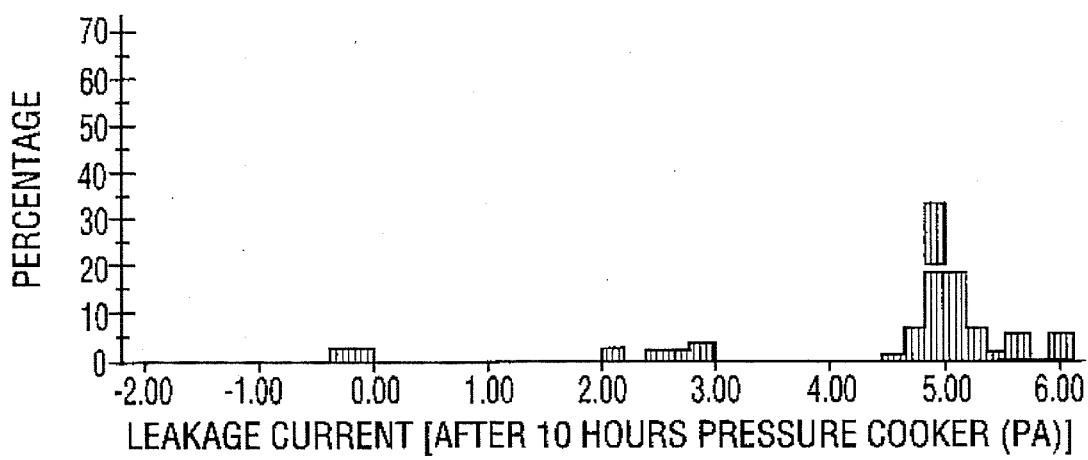
Figure 11C:
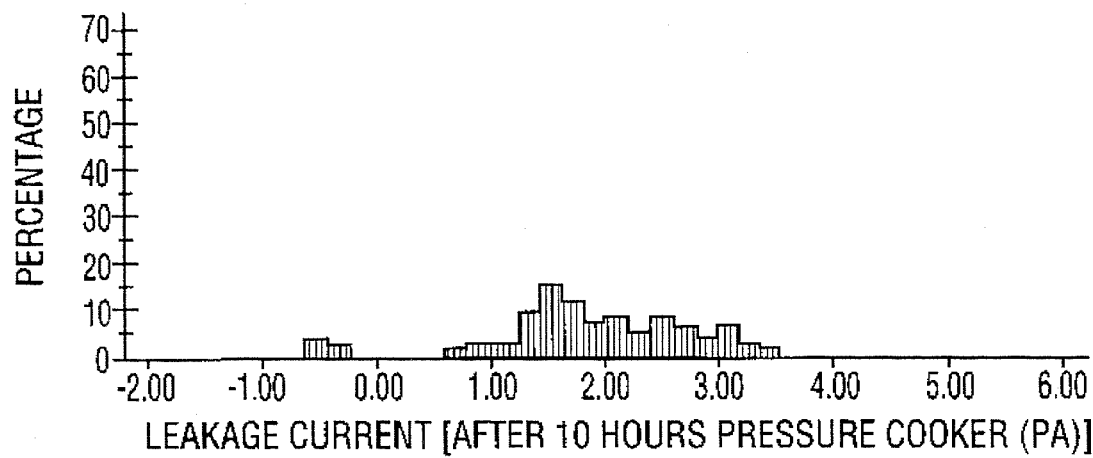

A ten (10) hours pressure cooker exposure at 121° C. and 175 kPa causes even larger moisture penetration in the dielectrics and increases even more inter-comb leakage current. The high leakage current (about 250,000 pA or 0.25 μA) associated with structure A using single passivation (FIG. 11a) and the comparable leakage current (about 100,000 pA or 0.1 μA) associated with double passivation (FIG. 11b) again shows that the reduced step coverage and weak points of a double thickness passivation cause the improvement to be minimal. The SOG passivation (FIG. 11c) maintains a three order of magnitude lower leakage current (about 100 pA).

Figure 12A:
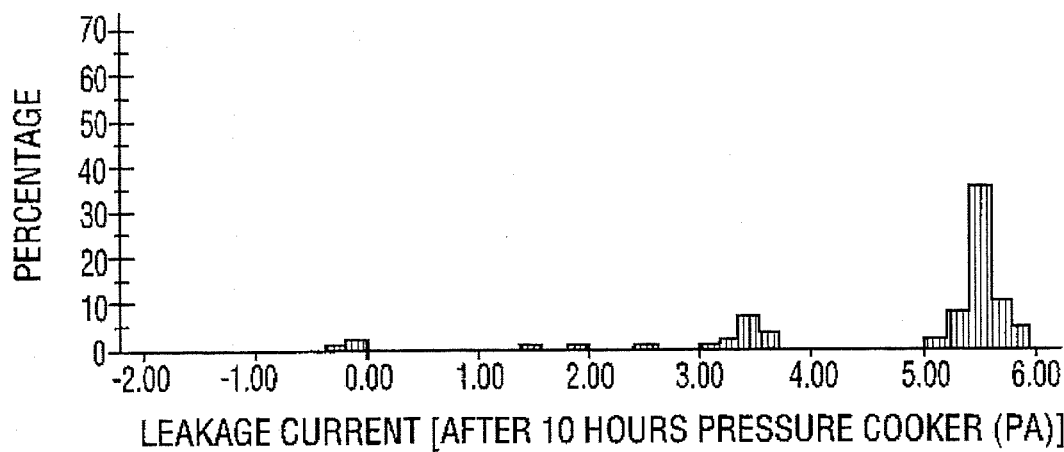
FIGS. 12a to 12c show similar results to FIGS. 8a to 8c after ten hours in a pressure cooker.
Figure 12B:
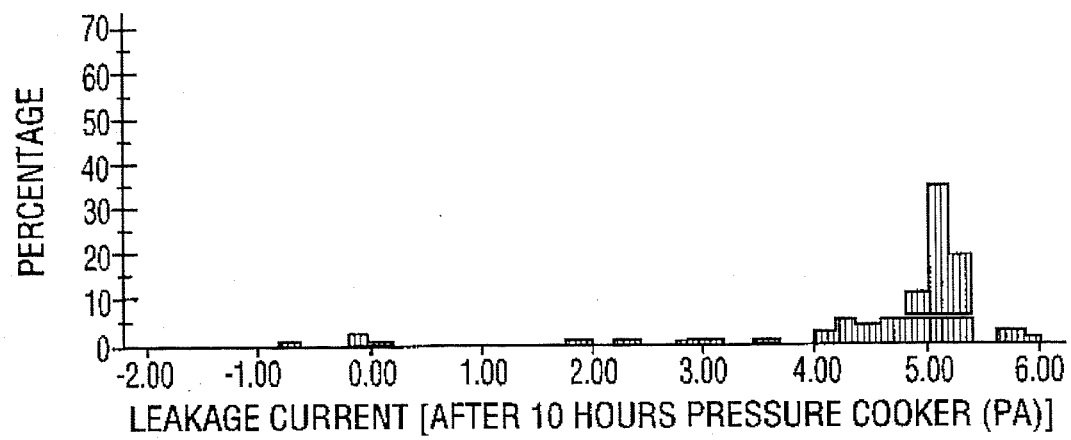
Figure 12C:
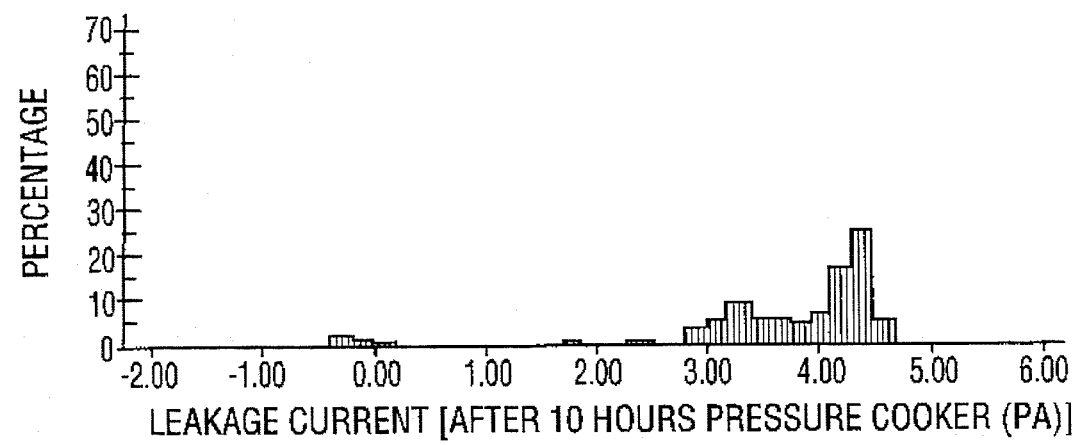

In the case of the more sensitive structure B after ten hours in a pressure cooker, single passivation and double passivation (FIGS. 12a and 12b) show almost the same high leakage current (about 300,000 pA or 0.3 μA) while the leakage current of the SOG passivation (about 10,000 pA or 10 nA) shows the first signs of important moisture penetration in the inter-comb dielectric area.

Structure B was only used as a very sensitive demonstration vehicle. In a real semiconductor device, the first level interconnect is deposited over a high density and high temperature dielectric of similar quality as the field oxide and, for that reason, the results of structure no. 1 are more realistic.

These results indicate that the improved step coverage of the SOG passivation over underlying topography permits much better protection against moisture related degradation than standard vapour phase deposited passivation layers or thicker such passivation layers.

I claim:

1. A method of passivating a semiconductor device, comprising the steps of depositing a first dielectric passivation layer onto the surface of the device, spinning at least one planarization layer onto said first passivation layer from an inorganic spin-on glass solution containing organometallic molecules of X and silicon, where X is selected from the group consisting of phosphorus, arsenic and antimony, said spin-on glass solution being pre-reacted prior to spinning to form complex organometallic molecules of about 1000 to 5000 u.m.a. of molecular weight with at least one Si.O.X bond between said organometallic molecules of silicon and X, passing the device through successive hot plates in a dry inert gas ambient to remove residual moisture and volatile components, and subsequently depositing a second dielectric passivation layer on said at least one planarization layer, said device being maintained in said dry inert gas ambient after application of the spin-on glass layer until said second dielectric layer is deposited.

2. A method as claimed in claim 1, characterized in that the thickness of the first dielectric passivation layer lies in the range of about 0.2 to 1.0 μm.

3. A method as claimed in claim 1, characterized in that the thickness of the first dielectric passivation layer is about 0.5 μm.

4. A method as claimed in any one of claim 1, characterized in that the first layer is selected from the group consisting of: doped silicon nitride, undoped silicon nitride, doped silicon oxinitride, undoped silicon oxinitride, and a combination thereof.

5. A method as claimed in any one of claim 1, characterized in that the first layer is undoped stoichiometric silicon oxinitride having a compressive stress lower than 2.0E9 dynes/cm$^2$ and a concentration of Si-H bonds less than 4.0 E21/cm$^3$.

6. A method as claimed in claim 1, characterized in that the spin on glass layer is made from phosphorus-doped spin-on glass solution that permits the formation of a layer having about 1.0 to 5.0 wt % phosphorus after a final cure at about 425° C.

7. A method as claimed claim 6, characterized in that the thickness of the spin-on glass layer lies in the range of about 35 to 150 nm.

8. A method as claimed in claim 6, characterized in that the thickness of the spin-on glass layer is 75 nm.

9. A method as claimed in claim 1, characterized in that the dry inert gas is nitrogen.

10. A method as claimed in claim 1, characterized in that the temperature of the hot plates at the successive stations increases from a first temperature lower than about 120° C. to a last temperature higher than about 300° C.

11. A method as claimed in claim 10, characterized in that the first temperature is about 80° C. and the last temperature is about 350° C.

12. A method as claimed in claim 1, characterized in that the second dielectric layer is selected from the group consisting of: doped silicon nitride, undoped silicon nitride, silicon oxinitride, undoped silicon oxinitride, and a combination thereof.

13. A method as claimed in claim 1, characterized in that the second layer is silicon nitride having a compressive stress less than about 2.0E9 dynes/cm$^2$ and a concentration of Si-H bonds less than about 4.0 E21/cm$^3$.

14. A method as claimed in claim 13, characterized in that the thickness of the second layer lies in the range of about 0.5 to 1.5 μm.

15. A method as claimed in claim 13, characterized in that the thickness of the second layer is about 1.0 μm.

16. A method as claimed in claim 13, characterized in that the second layer is deposited by plasma enhanced vapour deposition at a temperature of less than about 450° C.

\* \* \* \* \*